US006472757B2

(12) United States Patent
Marathe et al.

(10) Patent No.: US 6,472,757 B2
(45) Date of Patent: Oct. 29, 2002

(54) CONDUCTOR RESERVOIR VOLUME FOR INTEGRATED CIRCUIT INTERCONNECTS

(75) Inventors: Amit P. Marathe, Milpitas, CA (US); Pin-Chin Connie Wang, Menlo Park, CA (US); Christy Mei-Chu Woo, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/758,994

(22) Filed: Jan. 11, 2001

(65) Prior Publication Data

US 2002/0093057 A1 Jul. 18, 2002

(51) Int. Cl.⁷ .............................................. H01L 23/528
(52) U.S. Cl. ...................... 257/774; 257/751; 257/752; 257/758
(58) Field of Search ................................ 257/751, 752, 257/758, 774

(56) References Cited

U.S. PATENT DOCUMENTS 6,004,883 A * 12/1999 Yu et al. ..................... 438/706
6,080,669 A * 6/2000 Iacoponi et al. ............. 427/531
6,147,404 A * 11/2000 Pramanick et al. .......... 257/750
6,150,723 A * 11/2000 Harper et al. ............... 257/751
6,252,290 B1 * 6/2001 Quek et al. .................. 257/522

* cited by examiner

Primary Examiner—Allan R. Wilson
(74) Attorney, Agent, or Firm—Mikio Ishimaru

(57) ABSTRACT

An integrated circuit and manufacturing method therefor is provided having a semiconductor substrate with a semiconductor device. A device dielectric layer is formed on the semiconductor substrate. A first dielectric layer on the device dielectric layer has an opening formed therein including a conductor reservoir volume. A barrier layer lines the channel opening. A conductor core fills the opening over the barrier layer. A second dielectric layer is formed on the first dielectric layer and has a second channel and via opening provided therein. A barrier layer lines the second channel and via opening except over the first channel opening. A conductor core fills the second channel and via opening over the barrier layer and the first conductor core to form the second channel and via. The conductor reservoir volume provides a supply of conductor material to prevent the formation of voids in the first channel and in the via.

6 Claims, 2 Drawing Sheets

US 6,472,757 B2

CONDUCTOR RESERVOIR VOLUME FOR INTEGRATED CIRCUIT INTERCONNECTS

TECHNICAL FIELD

The present invention relates generally to semiconductor technology and more specifically to preventing interconnect voids in semiconductor devices.

BACKGROUND ART

In the manufacture of integrated circuits, after the individual devices such as the transistors have been fabricated in and on the semiconductor substrate, they must be connected together to perform the desired circuit functions. This interconnection process is generally called "metallization" and is performed using a number of different photolithographic, deposition, and removal techniques.

In one interconnection process, which is called a "dual damascene" technique, two channels of conductor materials are separated by interlayer dielectric layers in vertically separated planes perpendicular to each other and interconnected by a vertical connection, or "via", at their closest point. The dual damascene technique is performed over the individual devices which are in a device dielectric layer with the gate and source/drain contacts, extending up through the device dielectric layer to contact one or more channels in a first channel dielectric layer.

The first channel formation of the dual damascene process starts with the deposition of a thin first channel stop layer. The first channel stop layer is an etch stop layer which is subject to a photolithographic processing step which involves deposition, patterning, exposure, and development of a photoresist, and an anisotropic etching step through the patterned photoresist to provide openings to the device contacts. The photoresist is then stripped. A first channel dielectric layer is formed on the first channel stop layer. Where the first channel dielectric layer is of an oxide material, such as silicon oxide ($SiO_2$), the first channel stop layer is a nitride, such as silicon nitride (SiN), so the two layers can be selectively etched.

The first channel dielectric layer is then subject to further photolithographic process and etching steps to form first channel openings in the pattern of the first channels. The photoresist is then stripped.

An optional thin adhesion layer is deposited on the first channel dielectric layer and lines the first channel openings to ensure good adhesion of subsequently deposited material to the first channel dielectric layer. Adhesion layers for copper (Cu) conductor materials are composed of compounds such as tantalum nitride (TaN), titanium nitride (TiN), or tungsten nitride (WN).

These nitride compounds have good adhesion to the dielectric materials and provide good barrier resistance to the diffusion of copper from the copper conductor materials to the dielectric material. High barrier resistance is necessary with conductor materials such as copper to prevent diffusion of subsequently deposited copper into the dielectric layer, which can cause short circuits in the integrated circuit.

However, these nitride compounds also have relatively poor adhesion to copper and relatively high electrical resistance.

Because of the drawbacks, pure refractory metals such as tantalum (Ta), titanium (Ti), or tungsten (W) are deposited on the adhesion layer to line the adhesion layer in the first channel openings. The refractory metals are good barrier materials, have lower electrical resistance than their nitrides, and have good adhesion to copper.

In some cases, the barrier material has sufficient adhesion to the dielectric material that the adhesion layer is not required, and in other cases, the adhesion and barrier material become integral. The adhesion and barrier layers are often collectively referred to as a "barrier" layer herein.

For conductor materials such as copper, which are deposited by electroplating, a seed layer is deposited on the barrier layer and lines the barrier layer in the first channel openings. The seed layer, generally of copper, is deposited to act as an electrode for the electroplating process.

A first conductor material is deposited on the seed layer and fills the first channel opening. The first conductor material and the seed layer generally become integral, and are often collectively referred to as the conductor core when discussing the main current-carrying portion of the channels.

A chemical-mechanical polishing (CMP) process is then used to remove the first conductor material, the seed layer, and the barrier layer above the first channel dielectric layer to form the first channels. When a layer is placed over the first channels as a final layer, it is called a "cap" layer and a "single" damascene process is completed. When the layer is processed further for placement of additional channels over it, the layer is a via stop layer.

The via formation step of the dual damascene process starts with the deposition of a thin via stop layer over the first channels and the first channel dielectric layer. The via stop layer is an etch stop layer which is subject to photolithographic processing and anisotropic etching steps to provide openings to the first channels. The photoresist is then stripped.

A via dielectric layer is formed on the via stop layer. Again, where the via dielectric layer is of an oxide material, such as silicon oxide, the via stop layer is a nitride, such as silicon nitride, so the two layers can be selectively etched. The via dielectric layer is then subject to further photolithographic process and etching steps to form the pattern of the vias. The photoresist is then stripped.

A second channel dielectric layer is formed on the via dielectric layer. Again, where the second channel dielectric layer is of an oxide material, such as silicon oxide, the via stop layer is a nitride, such as silicon nitride, so the two layers can be selectively etched. The second channel dielectric layer is then subject to further photolithographic process and etching steps to simultaneously form second channel and via openings in the pattern of the second channels and the vias. The photoresist is then stripped.

An optional thin adhesion layer is deposited on the second channel dielectric layer and lines the second channel and the via openings.

A barrier layer is then deposited on the adhesion layer and lines the adhesion layer in the second channel openings and the vias.

Again, for conductor materials such as copper and copper alloys, which are deposited by electroplating, a seed layer is deposited by electroless deposition on the barrier layer and lines the barrier layer in the second channel openings and the vias.

A second conductor material is deposited on the seed layer and fills the second channel openings and the vias.

A CMP process is then used to remove the second conductor material, the seed layer, and the barrier layer above the second channel dielectric layer to form the first channels. When a layer is placed over the second channels as a final layer, it is called a "cap" layer and the "dual" damascene process is completed.

The layer may be processed further for placement of additional levels of channels and vias over it.

The use of the single and dual damascene techniques eliminates metal etch and dielectric gap fill steps typically used in the metallization process. The elimination of metal etch steps is important as the semiconductor industry moves from aluminum (Al) to other metallization materials, such as copper, which are very difficult to etch.

A major problem occurs with interconnects at the interconnection of the channels with the vias. When current flow through the interconnect causes internal electromigration of copper from the via, the copper is not made up from the channel because of the barrier layer which prevents copper diffusion between the channel and the via above it, and this leads to voids in the via which leads to integrated circuit failure over time.

If the barrier layer is eliminated between the channel and the via above it, voids could form in the channel which also lead to integrated circuit failure over time.

A solution to this problem has been long sought but has long eluded those skilled in the art.

DISCLOSURE OF THE INVENTION

The present invention provides an integrated circuit having a semiconductor substrate with a semiconductor device. A first dielectric layer is on the semiconductor substrate and has a first channel opening provided therein. The first channel opening is provided with a channel reservoir volume. A barrier layer lines the first channel opening, and a first conductor core fills the first channel opening over the barrier layer to form a first channel. A second dielectric layer is formed on the first dielectric layer and has a second channel and via opening provided therein. A barrier layer lines the second channel and via opening except over the first channel opening. A conductor core fills the second channel and via opening over the barrier layer and the first conductor core to form the second channel and via. The conductor reservoir volume provides a supply of conductor material to prevent the formation of voids in the first channel and in the via.

The present invention further provides a method for manufacturing an integrated circuit having a semiconductor substrate with a semiconductor device. A first dielectric layer is formed on the semiconductor substrate and has a first channel opening formed therein. The first channel opening is formed with a channel reservoir volume. A barrier layer lines the first channel opening, and a first conductor core fills the first channel opening over the barrier layer and both are removed over the first dielectric layer to form a first channel. A second dielectric layer is formed on the first dielectric layer and has a second channel and via opening formed therein. A barrier layer lines the second channel and via opening. The barrier layer in the via opening over the first channel opening is removed and a conductor core fills the second channel and via opening over the barrier layer and the first conductor core. The barrier layer and the conductor core are removed over the second dielectric layer to form the second channel and via. The conductor reservoir volume provides a supply of conductor material to prevent the formation of voids in the first channel and in the via during operation.

The present invention can also be used with a single damascene process as well as a dual damascene process.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
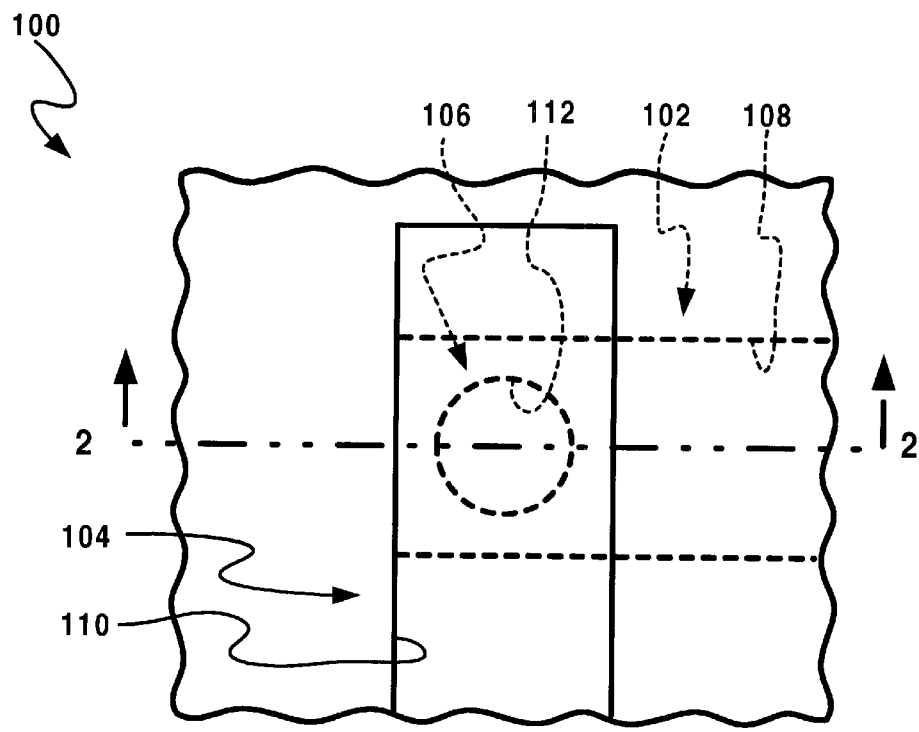
FIG. 1 (PRIOR ART) is a plan view of aligned channels with a connecting via.

Referring now to FIG. 1 (PRIOR ART), therein is shown a plan view of a semiconductor wafer 100 having as interconnects first and second channels 102 and 104 connected by a via 106. The first and second channels 102 and 104 are respectively disposed in first and second dielectric layers 108 and 110. The via 106 is an integral part of the second channel 104 and is disposed in a via dielectric layer 112.

The term "horizontal" as used in herein is defined as a plane parallel to the conventional plane or surface of a wafer, such as the semiconductor wafer 100, regardless of the orientation of the wafer. The term "vertical" refers to a direction perpendicular to the horizontal as just defined. Terms, such as "on", "above", "below", "side" (as in "sidewall"), "higher", "lower", "over", and "under", are defined with respect to the horizontal plane.

Figure 2:
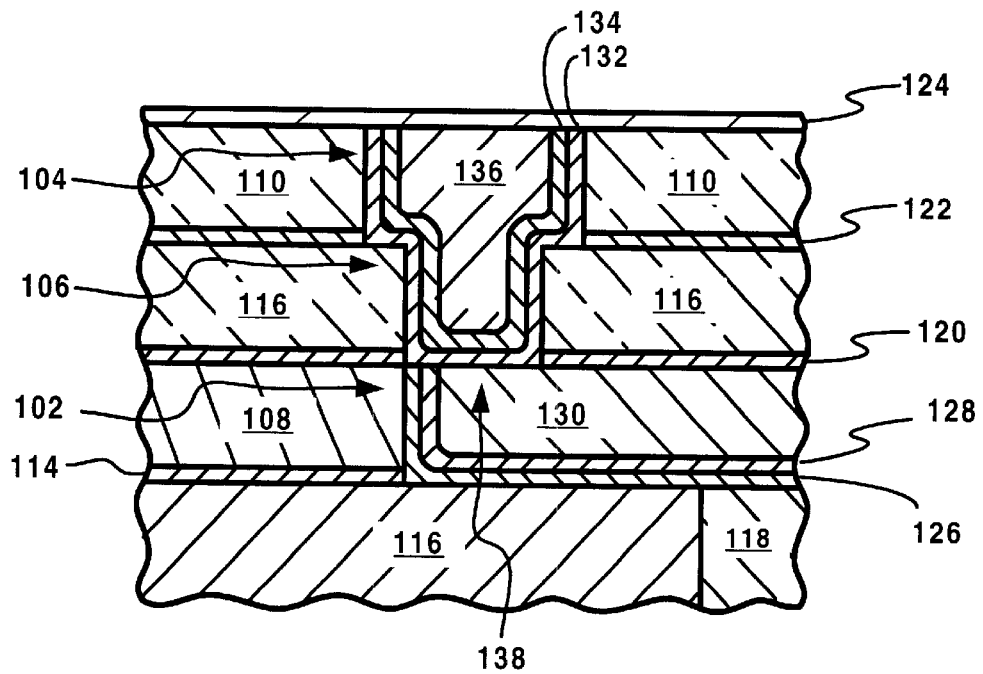
FIG. 2 (PRIOR ART) is a cross-section of FIG. 1 along line 2—2.

Referring now to FIG. 2 (PRIOR ART), therein is shown a cross-section of FIG. 1 (PRIOR ART) along line 2—2. A portion of the first channel 102 is disposed in a first channel stop layer 114 and is on a device dielectric layer 116. Generally, metal contacts are formed in the device dielectric layer 116 to connect to an operative semiconductor device (not shown). This is represented by the contact of the first channel 102 with a semiconductor contact 118 embedded in the device dielectric layer 116. The various layers above the device dielectric layer 116 are sequentially: the first channel stop layer 114, the first channel dielectric layer 108, a via stop layer 120, the via dielectric layer 112, a second channel stop layer 122, the second channel dielectric layer 110, and a next channel stop layer 124 (not shown in FIG. 1).

The first channel 102 includes a barrier layer 126, which could optionally be a combined adhesion and barrier layer, and a seed layer 128 around a conductor core 130. The second channel 104 and the via 106 include a barrier layer 132, which could also optionally be a combined adhesion and barrier layer, and a seed layer 134 around a conductor core 136.

The barrier layers 126 and 132 are used to prevent diffusion of the conductor materials into the adjacent areas of the semiconductor device. The seed layers 128 and 134 form electrodes on which the conductor material of the conductor cores 130 and 136 is deposited. The seed layers 128 and 134 are of substantially the same conductor material of the conductor cores 130 and 136 and become part of the respective conductor cores 130 and 136 after the deposition.

The deposition of the barrier layer 132 is such that it fills the bottom of the via 106 at barrier layer portion 138 so as to effectively separate the conductor cores 130 and 136.

In the past, for copper conductor material and seed layers, highly resistive diffusion barrier materials such as tantalum nitride (TaN), titanium nitride (TiN), or tungsten nitride (WN) are used as barrier materials to prevent diffusion. In addition to increasing the overall resistance of the semiconductor chip which contained all the semiconductor devices, the barrier region 138 would block diffusion of copper from the conductor core 130 to the conductor core 136 as electromigration caused the movement of copper atoms out of the via 106 and allowed the formation of voids therein.

Figure 3:
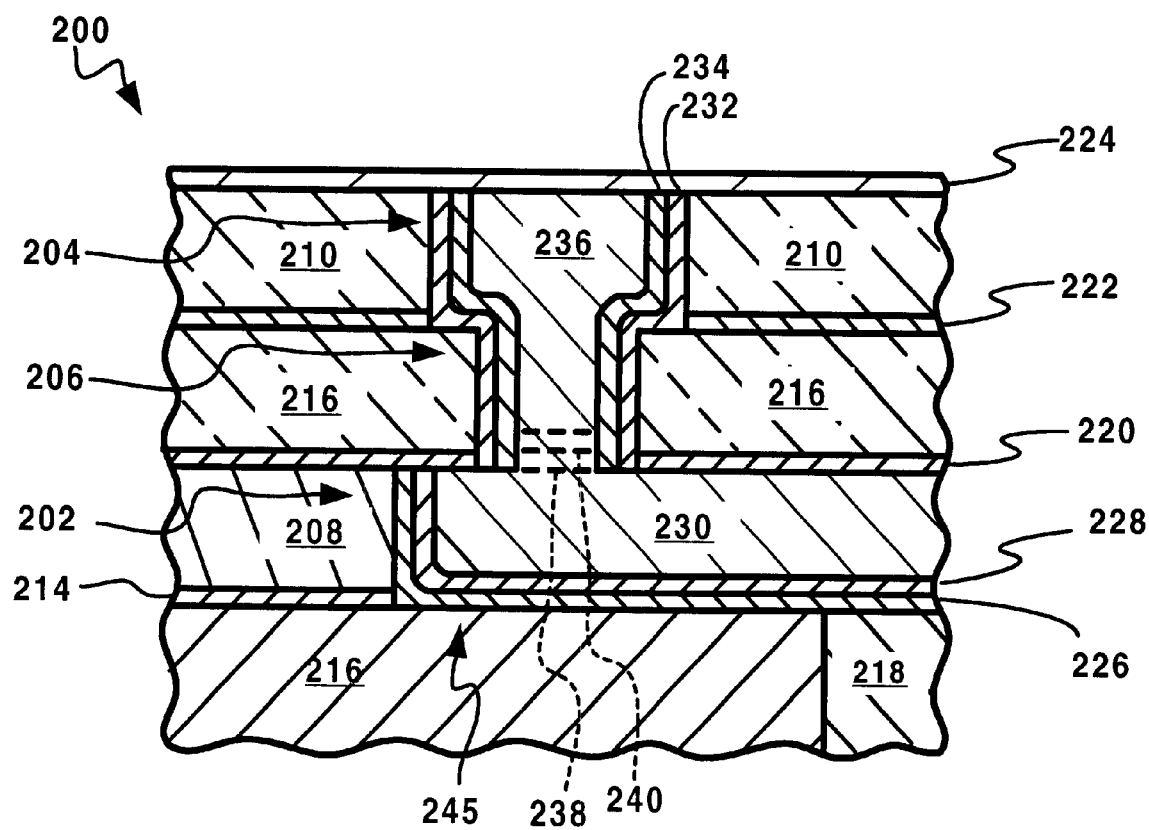
FIG. 3 is a cross-section similar to FIG. 2 (PRIOR ART) showing the conductor reservoir volume according to the present invention.

Referring now to FIG. 3, therein is shown a cross-section similar to that shown in FIG. 2 (PRIOR ART) of a semiconductor wafer 200 of the present invention. The semiconductor wafer 200 has first and second channels 202 and 204 connected by a via 206. The first and second channels 202 and 204 are respectively disposed in first and second dielectric layers 208 and 210. The via 206 is a part of the second channel 204 and is disposed in a via dielectric layer 212.

A portion of the first channel 202 is disposed in a first channel stop layer 214 and is on a device dielectric layer 216. Generally, metal contacts (not shown) are formed in the device dielectric layer 216 to connect to an operative semiconductor device (not shown). This is represented by the contact of the first channel 202 with a semiconductor device gate 218 embedded in the device dielectric layer 216. The various layers above the device dielectric layer 216 are sequentially: the first channel stop layer 214, the first channel dielectric layer 208, a via stop layer 220, the via dielectric layer 212, a second channel stop layer 222, the second channel dielectric layer 210, and a next channel stop layer 224.

The first channel 202 includes a barrier layer 226 and a seed layer 228 around a conductor core 230. The second channel 204 and the via 206 include a barrier layer 232 and a seed layer 234 around a conductor core 236. The barrier layers 226 and 232 are used to prevent diffusion of the conductor materials into the adjacent areas of the semiconductor device. The seed layers 228 and 234 form electrodes on which the conductor material of the conductor cores 230 and 236 is deposited. The seed layers 228 and 234 are of substantially the same conductor material of the conductor cores 230 and 236 and become part of the respective conductor cores 230 and 236 after the deposition.

The barrier layer 234 and the seed layer 232 are absent over the second channel 202 in the barrier removed region 238 and the seed layer removed region 240, respectively. To provide conductor material to make up for any losses due to electromigration from the first channel 202 through the via 206 to the second channel 204, a conductor reservoir volume 245 is provided. In the preferred embodiment, the conductor reservoir volume 245 is an extension placed at the dead end of the horizontal run of the channel 202 horizontally after the via 206.

While the conductor reservoir volume 245 can be of any size, the larger the volume, the longer it will provide protection of the associated via and channel from electromigration. Thus, the preferred volume would be one which is equal or greater than the volume of the via with which it is associated.

The method for manufacturing the present invention includes depositing the first dielectric layer 208 over the semiconductor wafer 200 on a substrate (not shown) by a deposition process such as chemical vapor deposition. A first channel opening is etched in the first dielectric layer 208. The barrier layer 226 is then deposited by a process such as chemical vapor deposition to line the first channel opening. The seed layer 228 is then deposited by a process such as sputtering to line the barrier layer 226. The seed layer 228 is then used as an electrode in an electroplating process to fill the first channel opening over the barrier layer 226 and seed layer 228 to form the first channel 202.

The via stop layer 220 is then deposited over the first dielectric layer 208 and the first channel 202 and the via dielectric layer 216 formed on the via stop layer 220 after photolithograph processing and etching to form a via opening. Subsequent processing forms the second channel stop layer 222 on the via stop layer 220 and the second dielectric layer 210 on the second channel stop layer 222.

After photolithographically processing, an etching process is then used to form a second channel and via opening through the second channel dielectric 210, the second channel stop layer 222, the via dielectric layer 216, and the via stop layer 220 to the first channel 202. In this process of forming the second channel 204 and via 206, the via 206 exposes the first channel 202 horizontally away from where the first channel 202 dead ends horizontally in FIG. 3. This provides the conductor reservoir volume 245 which is sized to be equal to or larger than the via 206.

The barrier layer 232 and the seed layer 234 are then deposited to line the second channel and via opening. The barrier layer 232 in the via opening over the first channel 202 at the barrier removed region 238 and the seed layer 234 in the via opening over the first channel 202 at the seed layer removed region 240 are then removed. It will be understood that, if the barrier layer 232 in the via opening is removed before deposition of the seed layer 234, the seed layer does not have to be removed in the via opening and will become part of the conductor core 236.

A subsequent electroplating process is used to deposit the conductor core 236 to fill the second channel and via opening to form the second channel 204 and the via 206 and be in electrical contact with the first conductor core 230.

The conductor reservoir volume 245 then provides a supply of conductor material to prevent the formation of voids in the first channel and in the via during operation.

It should be noted that while prior art integrated circuits may have volumes which appear to be conductor reservoir volumes, in fact, these are merely volumes which exist because of misalignments of the channels and vias. Similarly, other documents show what appear to be conductor reservoir volumes, but these are generally due to artistic license in rendering interconnects. Those skilled in the art realize that these volumes do not exist for the purpose of showing the present invention which would appear on substantially all channels below vias in an integrated circuit.

In the best mode, the barrier layers are of materials such as tantalum (Ta), titanium (Ti), tungsten (W), nitrides thereof, and a combination thereof. The seed layers and conductor cores are of materials such as copper (Cu), copper-base alloys, aluminum (Al), aluminum-base alloys, gold (Au), gold-base alloys, silver (Ag), silver-base alloys, and a combination thereof. The dielectric layers are of silicon dioxide or a low dielectric material such as HSQ, Flare, etc. The stop layers are of materials such as silicon nitride or silicon oxynitride.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

The invention claimed is:

1. An integrated circuit comprising:
   a semiconductor substrate having a semiconductor device provided thereon;

a first dielectric layer formed over the semiconductor substrate having a first opening provided therein including a conductor reservoir volume;

a first barrier layer lining the first opening; and a first conductor core filling the first opening and forming a first conductor connected to the semiconductor device;

a second dielectric layer formed over the first dielectric layer and having a via opening and a second opening provided therein;

a second barrier layer lining the via opening and the second opening except over the first conductor; and a second conductor core filling the via opening and, the second opening to form a via conductor and a second conductor, having the via conductor proximate the conductor reservoir volume at the end of the first conductor after the via conductor whereby conductor material migrates during operation due to electromigration from the conductor reservoir volume into the via conductor and second conductor wherein the volume of the conductor reservoir volume is sized to equal or exceed the volume of the via conductor.

2. The integrated circuit as claimed in claim 1 wherein the barrier layer is of a material selected from a group consisting of tantalum, titanium, tungsten, nitrides thereof, and a combination thereof.

3. The integrated circuit as claimed in claim 1 wherein the conductor core contains a material selected from a group consisting of copper, copper-base alloys, aluminum, gold, gold-base alloys, silver, silver-base alloys, and a combination thereof.

4. An integrated circuit comprising:

a silicon substrate having semiconductor devices provided thereon;

a device oxide layer formed over the silicon substrate;

a first channel oxide layer formed over the device oxide layer having a plurality of first channel openings provided therein including a plurality of conductor reservoir volumes;

first barrier layers lining the plurality of first channel openings;

first conductor cores filling the plurality of first channel openings and forming a plurality of first channels connected to the semiconductor devices;

a second channel oxide layer formed over the first channel oxide layer and having a plurality of second channel and via openings provided therein;

second barrier layers lining the plurality of second channel and via openings except over the plurality of first channels;

second conductor cores filling the plurality of second channel and via openings to form a plurality of vias and second channels, having the plurality of vias proximate the plurality of conductor reservoir volumes at the ends of the plurality of first channels horizontally after the plurality of vias whereby conductor material migrate in operation due to electromigration from the conductor reservoir volumes into the plurality of vias wherein the volumes of the plurality of conductor reservoir volumes are sized to equal or exceed the volumes of the vias.

5. The integrated circuit as claimed in claim 4 wherein the barrier layers contain a metal selected from a group consisting of tantalum, titanium, tungsten, and a combination thereof.

6. The integrated circuit as claimed in claim 4 wherein the conductor cores contain a material selected from a group consisting of copper, copper-base alloys, aluminum, aluminum-based alloys, gold, gold-base alloys, silver, silver-base alloys, and a combination thereof.

* * * * *